(12) United States Patent
Lin et al.

(10) Patent No.: US 7,195,965 B2
(45) Date of Patent: Mar. 27, 2007

(54) PREMATURE BREAKDOWN IN SUBMICRON DEVICE GEOMETRIES

(75) Inventors: John Lin, Chelmsford, MA (US); Philip L. Hower, Concord, MA (US); Taylor R. Efland, Richardson, TX (US); Sameer Pendharkar, Richardson, TX (US); Vladimir Bolkhovsky, Framingham, MA (US)

(73) Assignee: Texas Instruments Incorporated, Dallas, TX (US)

( * ) Notice: Subject to any disclaimer, the term of this patent is extended or adjusted under 35 U.S.C. 154(b) by 332 days.

(21) Appl. No.: 10/302,256

(22) Filed: Nov. 22, 2002

(65) Prior Publication Data
US 2004/0079991 A1 Apr. 29, 2004

Related U.S. Application Data

(60) Provisional application No. 60/421,273, filed on Oct. 25, 2002.

(51) Int. Cl.
*H01L 21/8248* (2006.01)
(52) U.S. Cl. .................. 438/202; 438/309
(58) Field of Classification Search ............... 257/378, 257/336, 337, 344, 372, 373, 343, 335; 438/202, 438/204, 205, 207, 208, 313, 322, 327, 309
See application file for complete search history.

(56) References Cited

U.S. PATENT DOCUMENTS 4,746,967 A * 5/1988 Emoto et al. ............. 357/88
5,935,867 A * 8/1999 Alvis et al. ............... 437/35
6,297,119 B1 * 10/2001 Tsutsui et al. ............. 438/322
6,410,950 B1 * 6/2002 Sittig et al. ............... 257/287
6,528,850 B1 * 3/2003 Hebert ....................... 257/345
6,605,844 B2 * 8/2003 Nakamura et al. ......... 257/360
2003/0224612 A1 * 12/2003 Merrett et al. ............. 438/741
2004/0188802 A1 * 9/2004 Babcock et al. ........... 257/565

OTHER PUBLICATIONS

S. Wolf and R,N. Tauber, "Silicon Processing for the VLSI Era : vol. 1—Process Technology," Lattice Press, Sunset Beach, CA (1886), pp. 426-438.*
S. Wolf and R. N. Tauber, "Silicon Processing for thje VLSI Era : vol. 1—Process Technology," Lattice Press, Sunset Beach, CA (1986), p. 286.*
S.M. Sze, "Physics of Semiconductor Devices," John Wiley & Sons, New York (1981), pp. 73, 100, 102.*

* cited by examiner

*Primary Examiner*—Douglas W. Owens
(74) *Attorney, Agent, or Firm*—Peter K. McLarty; W. James Brady, III; Frederick J. Telecky, Jr.

(57) ABSTRACT

The concept of the present invention describes a semiconductor device with a junction 504 between a lightly doped region 501 and a heavily doped region 502, wherein the junction has an elongated portion 504a and curved portions 504b. The doping concentration of the lightly doped region is configured so that it exhibits higher resistivity in the proximity 510 of the curved portion by an amount suitable to lower the electric field strength during device operation and thus to offset the increased field strength caused by the curved portion. As a consequence, the device breakdown voltage in the curved junction portion becomes equal to or greater than the breakdown voltage in the linear portion.

4 Claims, 8 Drawing Sheets

PREMATURE BREAKDOWN IN SUBMICRON DEVICE GEOMETRIES

This application claims priority under 35 USC § 119 (e)(1) of provisioral application No. 60/421,273 filed Oct. 25, 2002.

FIELD OF THE INVENTION

The present invention is related in general to the field of semiconductor devices and processes, and more specifically to integrated circuits with finger-shaped MOS transistors, for which a solution to the premature breakdown due to curvature effects is needed.

DESCRIPTION OF THE RELATED ART

In semiconductor literature, it has been described how severely the breakdown voltage of semiconductor junctions can be affected, when the junction is not simply plane but includes curved portions, as is needed by the planar technology. As an example, a useful summary can be found in "Physics of Semiconductor Devices" by S, M. Sze, second edition 1981, John Wiley, New York. A simplified version of FIG. 9 from Chapter 2 of that book is reproduced in FIGS. 1A and 1B. FIG. 1A depicts a simplified cross section through a p-region 101 diffused through a window of width 102a in insulating layer 102 into an n-type substrate 103. In planar technology, the p-n junction 104 curves toward the semiconductor surface 103a and intersects with surface 103a at 104a; the intersection 104a is protected by insulator 102. The radius of the junction curvature is designated rj.

FIG. 1B illustrates, in schematic perspective view, the p-type region of FIG. 1A to depict the finger-shaped geometry of the p-region. The plane portion 111 of width 102a and length 111b is surrounded by two portions shaped by the curvature of the p-n junction: Four cylindrical portions 112 (of different lengths) and four spherical portions 113. As stated in the above-quoted book on page 106, the cylindrical and/or spherical portions of the junction have higher electrical field intensity. Consequently, the avalanche breakdown voltage Vcy of the cylindrical portion and Vsp of the spherical portion are lower than the breakdown voltage Vb of the linear (plane) junction portions, dependent on the radius rj of the curvature of the junction.

Adopting FIG. 2 from FIG. 35 in Chapter 2 of the above-quoted book, the normalized breakdown voltage Vcy, Vsp/Vb of cylindrical and spherical junctions (one . . . -sided abrupt junctions) is plotted as a function of the normalized radius rj/Wm of the junction curvature (Wm is the depletion layer width at breakdown). As can be seen, the breakdown voltages of cylindrical junctions (curve 201) and spherical junctions (curve 202) drop significantly with shrinking radius rj. Small radius rj, however, are technically ever more attractive because of the trend towards shrinking feature sizes in semiconductor devices. This risk of premature breakdown due to curvature effects is particularly pronounced in sub-micron finger ends of MOS transistors fabricated with the lateral double-diffused MOS (LDMOS) technology, a methodology especially popular for MOS high voltage and/or power devices, for which the widely used CMOS technology is practical.

An urgent need has therefore arisen for a coherent, low-cost method of preventing this lowering of the breakdown voltage. It would be desirable that the solution could be found in a technical approach not limited to a particular device strategy such as LDMOS. The fabrication method should be simple, yet flexible enough for different semiconductor product families and a wide spectrum of design and process variations. The design and process solutions should further provide excellent electrical performance, mechanical stability and high reliability. Preferably, these innovations should be accomplished without extending production cycle time, and using the installed equipment, so that no investment I . . . n new manufacturing machines is needed.

SUMMARY OF THE INVENTION

The concept of the present invention describes a semiconductor device with a junction between a lightly doped region and a heavily doped region, wherein the junction has an elongated portion and a curved portion. The doping concentration of the lightly doped region is configured so that it exhibits higher resistivity in the proximity of the curved portion by an amount suitable to lower the electric field strength during device operation and thus to offset the increased field strength caused by the curved portion. As a consequence, the device breakdown voltage in the curved junction portion becomes equal to or greater than the breakdown voltage in the linear portion.

The extra-lightly doped region of the invention is created by applying a photoresist layer over the wafer surface and patterning the layer to leave resist in the areas which define the regions intended for extra-low doping concentration. In the subsequent high energy ion implant step, the photoresist blocks the ions in those resist-defined areas. A diffusion step at predetermined temperatures and times drives the implanted ions sidewise (as well as deeper) into the semiconductor material, including into the regions previously shielded by the photoresist. Thus, the diffused ions establish a zone of light doping, or high resistivity.

Based on the dependence of the breakdown voltage of one-sided abrupt junctions in silicon as a function of the impurity doping concentration, computer programs determine the right amount of doping for creating the high resistivity region for controlling the unwelcome high-field effect of junction curvature. The computer programs further control the amount of ions and the time and temperature of diffusion.

The invention has been applied successfully in several embodiments. The first embodiment is an elongated reverse diode with a lightly doped region, a heavily doped region, and a junction shaped to include elongated linear portions and curved portions. The doping concentration of the lightly doped region is configured so that it exhibits higher resistivity in the proximity of the curved portions by an amount suitable to lower the electrical field strength during device operation and thus offset the increased field strength caused by the curved portions. Thus, the device breakdown voltage in the curved portions becomes equal to or greater than the breakdown voltage in the linear portions.

The second embodiment is an elongated, lateral double-diffused MOS (LDMOS) power transistor with source, gate and drain. The gate is shaped to include elongated linear portions and semicircular end portions. The gate surrounds the source and the drain surrounds the gate. The doping concentration of the drain diffusion is configured so that it exhibits higher resistivity in the proximity of the semicircular end portions by an amount suitable to lower the electrical field strength during device operation and thus offset the increased field strength caused by the semicircular end portions. Thus, the device breakdown voltage near the semicircular end portions becomes equal to or greater than the breakdown voltage near the linear portions.

The third embodiment goes beyond the concept of suppression of a curvature effect and its deteriorating consequence for the breakdown voltage. The third embodiment is an elongated, lateral double-diffused MOS (LDMOS) power transistor in a substrate with buried layer. The gate is shaped to include elongated linear portions and semicircular end portions. The gate surrounds the source and the drain surrounds the gate. The doping concentration of the drain diffusion is configured so that it exhibits higher resistivity throughout the extent of said source region by an amount suitable to lower the electric field strength. Thus, the device breakdown voltage becomes less affected by the buried layer.

The fourth embodiment is a combination of the intentions underlying the second and third embodiments. The fourth embodiment is an elongated, lateral double-diffused MOS (LDMOS) power transistor in a substrate with buried layer. The gate is shaped to include elongated linear portions and semicircular end portions. The gate surrounds the source and the drain surrounds the gate. The doping concentration of the drain diffusion is configured so that it exhibits both

- higher resistivity throughout the extent of said source region by an amount suitable to lower the electric field strength, and
- additional higher resistivity in the proximity of the semicircular end portions by an amount suitable to lower the electrical field strength during device operation and thus offset the increased field strength caused by the semicircular end portions.

Consequently, the device breakdown voltage near the curved end portions becomes equal to or greater than the breakdown voltage near the linear portions, and the breakdown voltage becomes less affected by the buried layer.

The fifth embodiment is an elongated bipolar transistor with emitter, base and collector. The collector-base junction is shaped to include elongated linear portions and curved portions. The doping concentration of the collector region is configured so that it exhibits higher resistivity in the proximity of the curved portions by an amount suitable to lower the electrical field strength during device operation and thus offsets the increased field strength caused by the curved portions. Thus, the device breakdown voltage in the curved portions becomes equal to or greater than the breakdown voltage in the linear portions.

It is a technical advantage of the present invention that the method of creating regions of higher resistivity can be applied to many device structures and designs. Further, the method does not add significant processing time or expense to the integrated circuit.

The technical advances represented by the invention, as well as the aspects thereof, will become apparent from the following description of the preferred embodiments if the invention, when considered in conjunction with the accompanying drawings and the novel features set forth in the appended claims.

DETAILED DESCRIPTION OF THE PREFERRED EMBODIMENTS

Figure 1A:
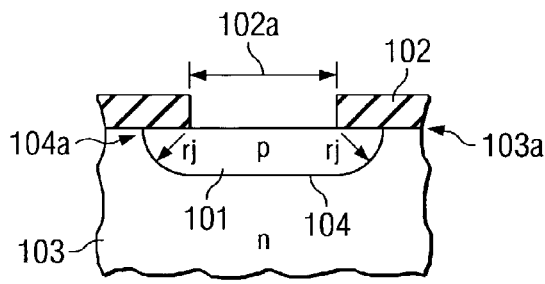
FIG. 1A is a schematic cross section through a p-n junction formed by the planar technology.
Figure 1B:
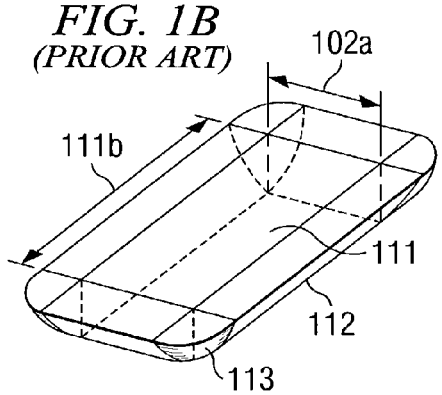
FIG. 1B is a schematic perspective view, in three dimensions, of a semiconductor having a doped layer with a p-n junction formed by the planar technology.
Figure 2:
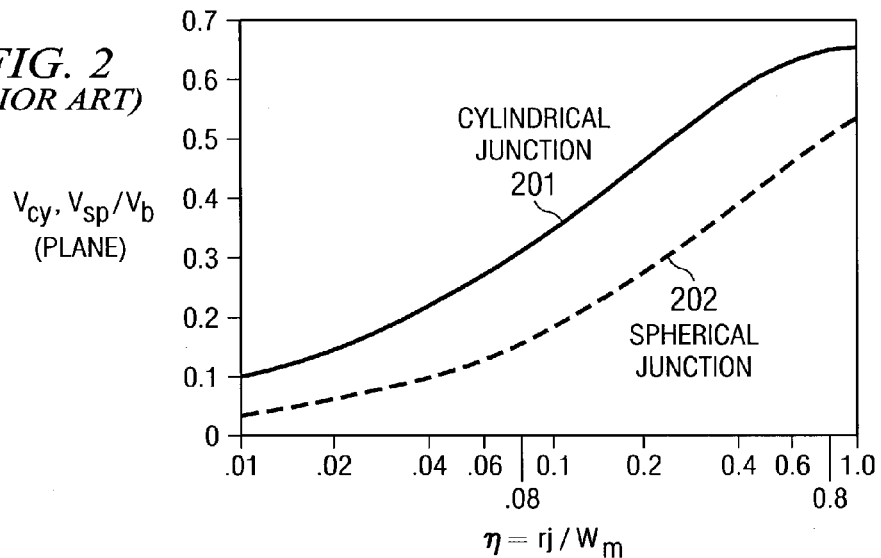
FIG. 2 shows the normalized breakdown voltage of cylindrical and spherical junctions as a function of the normalized radius of the junction curvature.
Figure 3:
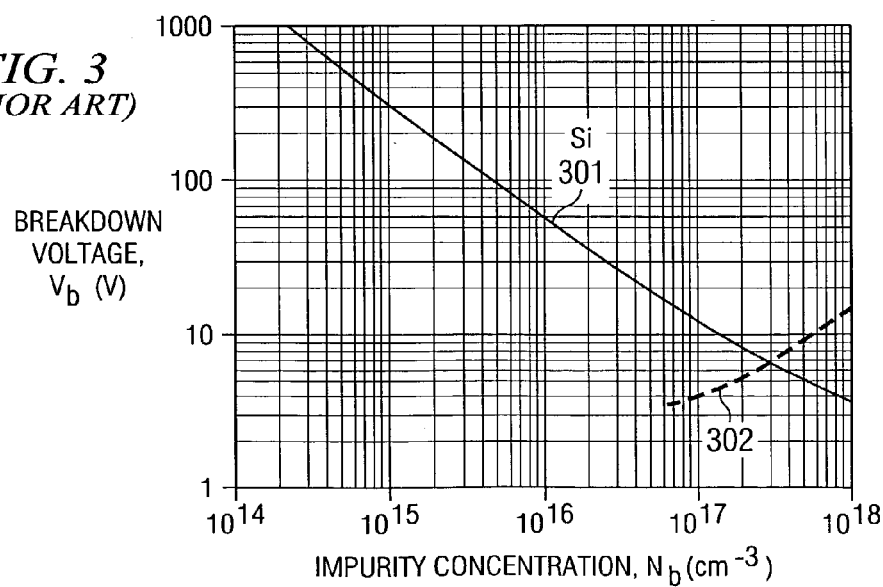
FIG. 3 plots the junction breakdown voltage as a function of the impurity concentration.

FIG. 3 plots the avalanche breakdown voltage Vb (expressed in V) for a one-sided abrupt junction as a function of impurity concentration Nb in silicon (expressed in cm-3). In the double-logarithmic coordinate system of FIG. 3, the line 301 indicates the strong dependence of the breakdown voltage Vb on the doping concentration Nb over several orders of magnitude (the dashed line 302 indicates the maximum doping beyond which the tunneling mechanism will dominate the voltage breakdown characteristic). Curves like FIG. 3 of the breakdown voltage versus doping concentration can be found in S. M. Sze, "Physics of Semiconductor Devices", second edition 1981, p. 101, John Wiley, New York. This strong dependence of the breakdown voltage on the impurity doping concentration is exploited by the present invention.

It should be noted that while most of the following discussion uses silicon as the starting semiconductor material, the invention is not limited to silicon. Analogous considerations apply to germanium, silicon germanium, silicon carbide, gallium arsenide, gallium phosphide, and any other semiconductor material commonly used in manufacturing. Curves correlating junction breakdown voltage with impurity concentration in these semiconductor materials have been published in literature.

Figure 4A:
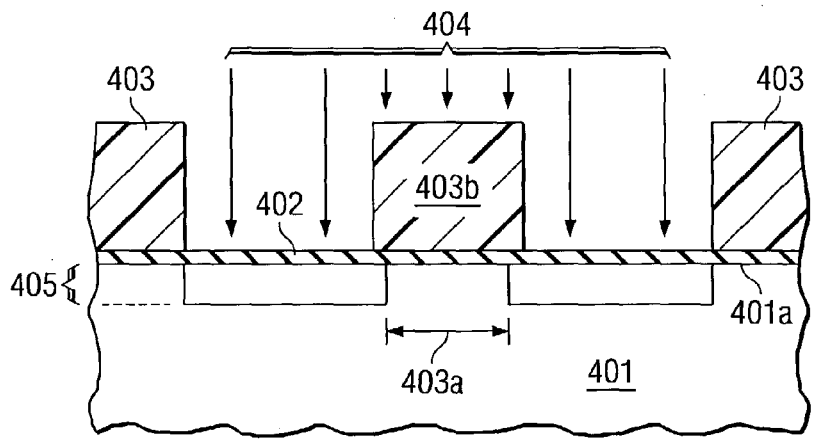
FIG. 4A is a schematic cross section through a patterned photoresist layer to block locally the implant of doping ions, illustrating the first phase of the method of the invention.
Figure 4B:
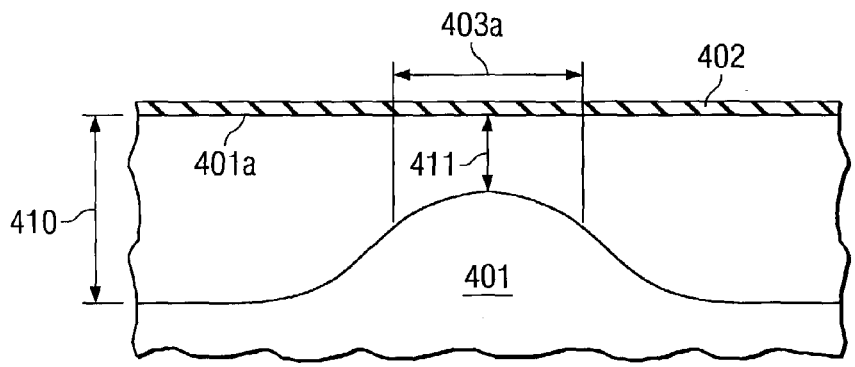
FIG. 4B is a schematic cross section through the non-implanted semiconductor showing the doping profile after diffusion in the second phase of the method of the invention.
Figure 4C:
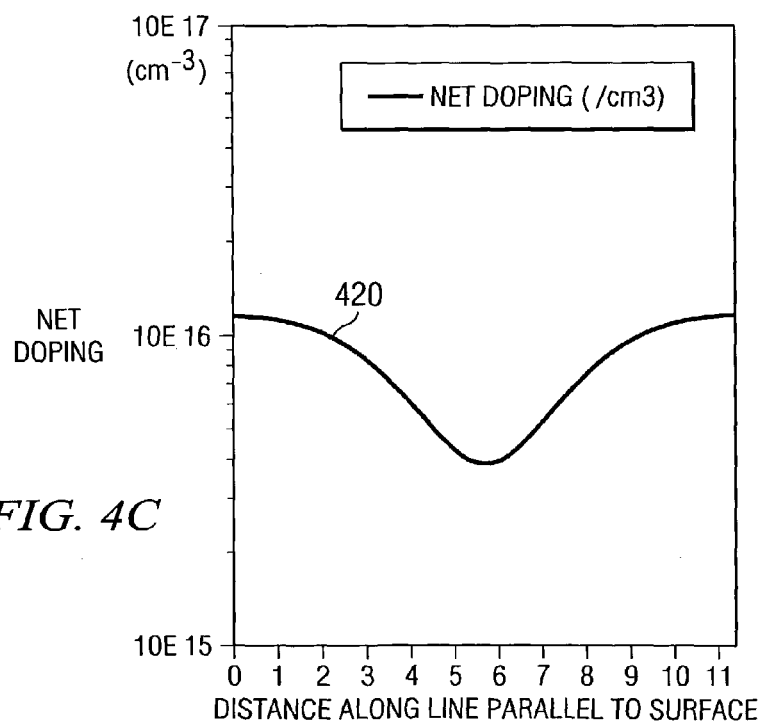
FIG. 4C plots the doping concentration as a function of the distance along the surface of the non-implanted semiconductor.

The principle of the method for creating a buried region having an impurity concentration lower than the surrounding volume of semiconductor material is shown in the schematic cross sections of FIGS. 4A, 4B, and 4C. A silicon substrate 401 of a first conductivity type (the considerations are equally applicable to p-type and n-type impurities) has a protective overcoat 402 on its surface 401a. This overcoat, preferably a screen oxide, may be about 20 to 30 nm thick. A photoresist layer 403 of a thickness suitable to shield against high energy ions is patterned to create a portion 403b of length 403a on the overcoat 402. The resist is soft baked, aligned with a mask, exposed to ultraviolet light, baked, and developed in order to pattern it by removing the portions exposed to light, and hard-baked. Ions 404 of the opposite conductivity type are implanted to form a surface-near implant layer 405. As an example, the ions may have between 100 and 200 keV energy and a medium dose of 3 to 4×10E12 cm-2. Due to photoresist portion 403b, no ions are implanted in the semiconductor substrate 401 for the length 403a; the region of width 403a remains un-implanted and is, therefore, often referred to as "cutout" region.

In the next process step, the photoresist layer is removed and the implanted ions of the opposite conductivity are diffused, for instance at 1150° C. for 800 min. As FIG. 4B shows, this drive-in phase results in two distinctly different regions:

A region of relatively heavy doping concentration at the surface and deep penetration to depth 410;

A region of the shielded portion 403a, created by sidewise diffusion of the implanted ions, having light doping at the surface and shallow penetration to depth 411. This lightly doped region has high resistivity.

The resulting net doping concentration (line 420) is shown in FIG. 4C as a function of the distance along a line parallel to the surface. As FIG. 4C indicates, the surface doping is reduced to less than one half, but the junction depth (411 in FIG. 4B) is still adequate.

For detailed control of the doping concentration and junction depth, the implanted ion concentration and depth, as well as the diffusion time and temperature have to be computer controlled.

The concept of the invention can be applied to any junction, which separates a lightly doped region from a more heavily doped region, and has an elongated portion (for instance a linear portion) and a curved portion. According to the invention, the doping concentration of the lightly doped region is configured so that it exhibits higher resistivity in the proximity of the curved portion by an amount suitable to lower the electric field strength during device operation and thus offset the increased field strength caused by the curved portion. The embedded region of higher resistivity (or lower doping) is created by the technique of local "cutout" of ion implantation by means of a patterned photoresist layer and controlled sidewise diffusion of the neighboring implanted regions. As a result, the device breakdown voltage in the curved portion becomes equal to or greater than the breakdown voltage in the linear portion.

Figure 5A:
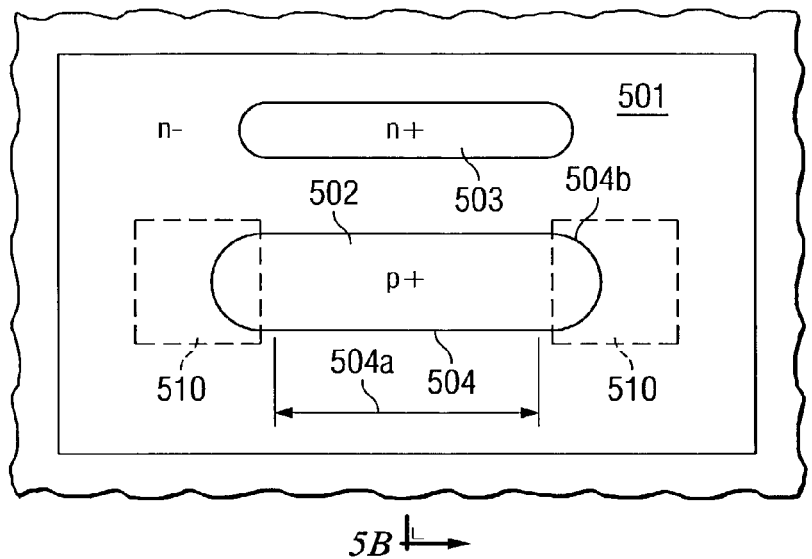
FIG. 5A is a schematic top view of an elongated diode junction having linear and curved portions, for determining the cut-out regions of the dopant ion implantation.
Figure 5B:
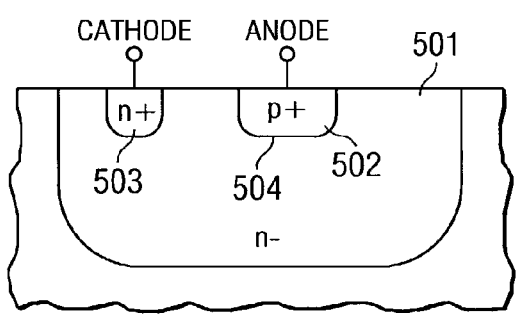
FIG. 5B shows a schematic cross section through the diode of FIG. 5A along line A–A'.

The first embodiment of the invention is a diode as illustrated in the example of FIG. 5A and 5B; FIG. 5A is a simplified top view, and FIG. 5B is the corresponding cross section along line A–A'. Embedded in a lightly doped n–type substrate 501 is an elongated p+ region 502, which serves as the anode of the reverse biased diode. The lightly doped n-region is contacted by the more heavily doped cathode region 503. As FIG. 5A depicts, the p-n junction 504 has a shape to include elongated linear portions 504a and curved portions 504b. Using the method of this invention described in conjunction with FIGS. 4A, 4B, and 4C for the regions 510, the doping concentration of the lightly doped n– region is configured so that it exhibits higher resistivity in the proximity 510 of the curved portions 504b by an amount suitable to lower the electrical field strength during device operation and thus offset the increased field strength caused by the curved portions 504b. The breakdown voltage of the reverse diode in the curved portions 504b becomes equal to or greater than the breakdown voltage in the linear portions 504a.

The principle outlined in FIGS. 5A and 5B can be realized in various device configurations. For instance, the reverse diode may be a multi-finger power diode. The lightly doped semiconductor region 501 may be n-type, as indicated in FIGS. 5A and 5B, or may be p-type. In the latter case, the heavily doped anode region is n+ type.

Figure 6:
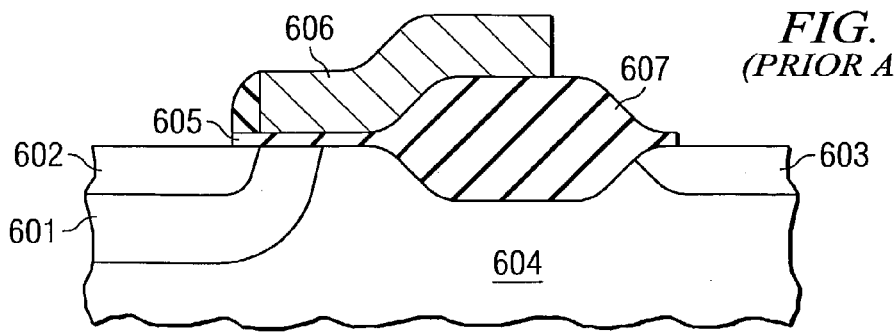
FIG. 6 is a schematic cross section through a lateral double diffused MOS (LDMOS) power transistor.

The second embodiment of the invention, an elongated, lateral double-diffused MOS (LDMOS) power transistor, is schematically depicted in the cross section of FIG. 6. In LDMOS, the semiconductor body 601 of a first conductivity type is produced by diffusion (in contrast to the body or well in CMOS technology). Further designated are the regions 602 for source and 603 for drain, both of the second conductivity type. Drain 603 has drain extension 604, also second conductivity type yet lightly doped for high voltage and high power. Over substrate 601 are the thin gate oxide 605 and the gate 606. Gate 606 is at least partially extended over drain extension 604, but separated from the drain extension 604 by the thick field oxide 607. As stated, LDMOS devices are constructed for high voltage, high power device applications.

Figure 7:
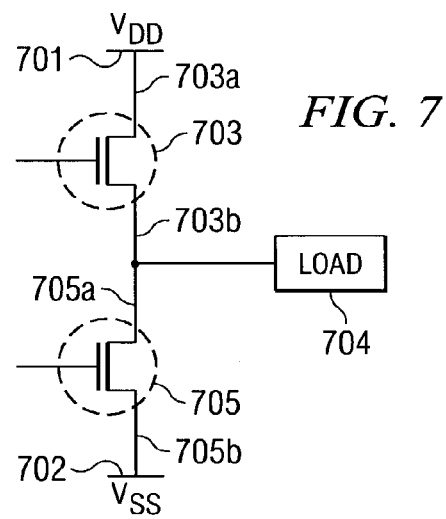
FIG. 7 shows a schematic circuit diagram explaining the definition of "high-side" and "low-side" LDMOS transistors.

In the schematic circuit diagram of FIG. 7, LDMOS devices are used in two different applications. Shown in FIG. 7 is the Vdd or power line 701 and the Vss or ground line 702. Next to the Vdd line 701 is the "high side" LDMOS transistor 703, connected to the Vdd line with its drain 703a. Source and body 703b of transistor 703 are connected to load 704. Next to the Vss line 702 is the "low side" LDMOS transistor 705, connected to the Vss line with its source 705b. The drain 705a of transistor 705 is connected to load 704 and source and body 703b of "high side" transistor 703.

In addition to the structure shown in FIG. 6, "high side" LDMOS transistors have a heavily doped buried layer of the second conductivity type, which separates the deep well of the second conductivity type from the substrate of the first conductivity type. The buried layer renders the device more resistant to punch-through effects, preventing the formation of parasitic vertical transistors.

Figure 8:
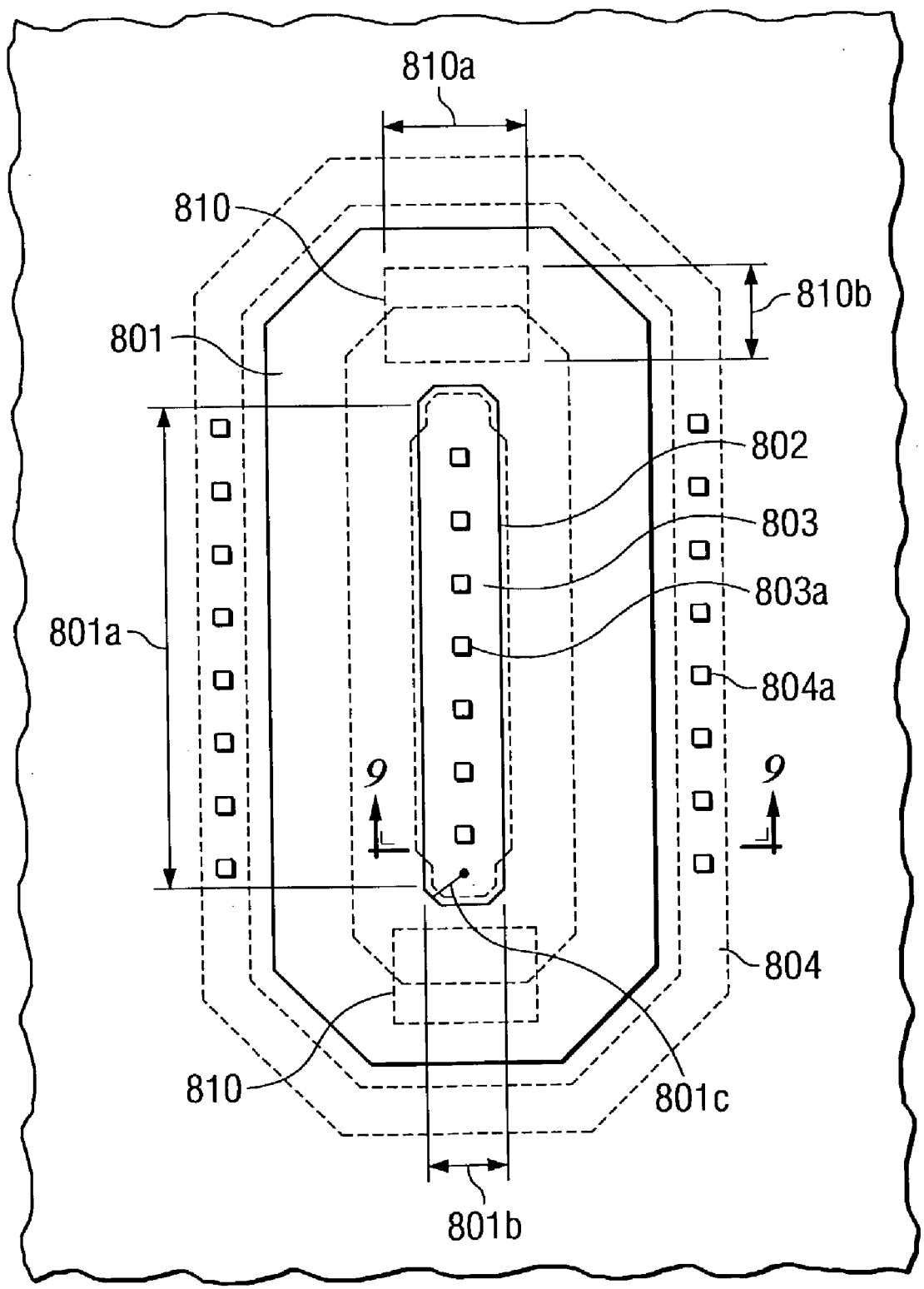
FIG. 8 shows a schematic top view of an elongated "low side" LDMOS transistor with the preferred regions for ion implantation cut-out.

The schematic top view of FIG. 8 illustrates the advantage of the "cutout" ion implant process according to the invention for the case of an elongated "low side" LDMOS transistor. The top view of FIG. 8 relates to the cross section of FIG. 6. Indicated by solid lines, the poly-silicon gate material 801 has a racetrack shape, consisting of linear portions 801a and semi-circular end portions 801b in the active transistor region. The inner radius 801c of the semi-circular end portions for advanced LDMOS devices is of the order of 1 µm or less.

Under the poly-silicon 801 are the thin gate oxide and the semiconductor of the first conductivity type 802, often called "body", which defines the active gate area. Body 802 also has racetrack contours. The inner body contour follows closely the inner gate contour, forming semicircular end portions of narrow radius (in advanced devices 1 μm or less). Body 802 surrounds the source area 803; source contacts are indicated by locations 803a. Drain 804 surrounds gate 803; drain contacts are indicated by locations 804a.

With a radius 801c of only 1 μm or less for advanced device solutions, a significant increase of electrical field strength and thus lowering of breakdown voltage is unavoidable. This fact is illustrated by the model in FIG. 9, which shows a schematic cross section along line A–A' in FIG. 8 of the "low side" LDMOS under the condition of electrical breakdown. The example of FIG. 9 refers to a device with p-type substrate and p-type body, but an analogous situation holds for n-type substrate and body. Over p-epitaxial silicon 901 is the deep n-well 902. It contains the p-body 903 (junction 903a), which faces the thin gate oxide 904 and surrounds the n+ source 905 (junction 905a). Source 905 is contacted by source metal 905b. Poly-silicon gate 906 stretches over thin gate oxide 904 and thick field oxide 907. The poly-silicon material of the gate is surrounded by sidewall spacers 908. An insulator 909 covers gate 906 and sidewall spacers 908; the metallic contacts to the gate are not shown in FIG. 9. The heavily doped n+ drain is designated 911 (the doping outlines are not shown in FIG. 9). Drain 911 is contacted by drain metal 911a.

Figure 9:
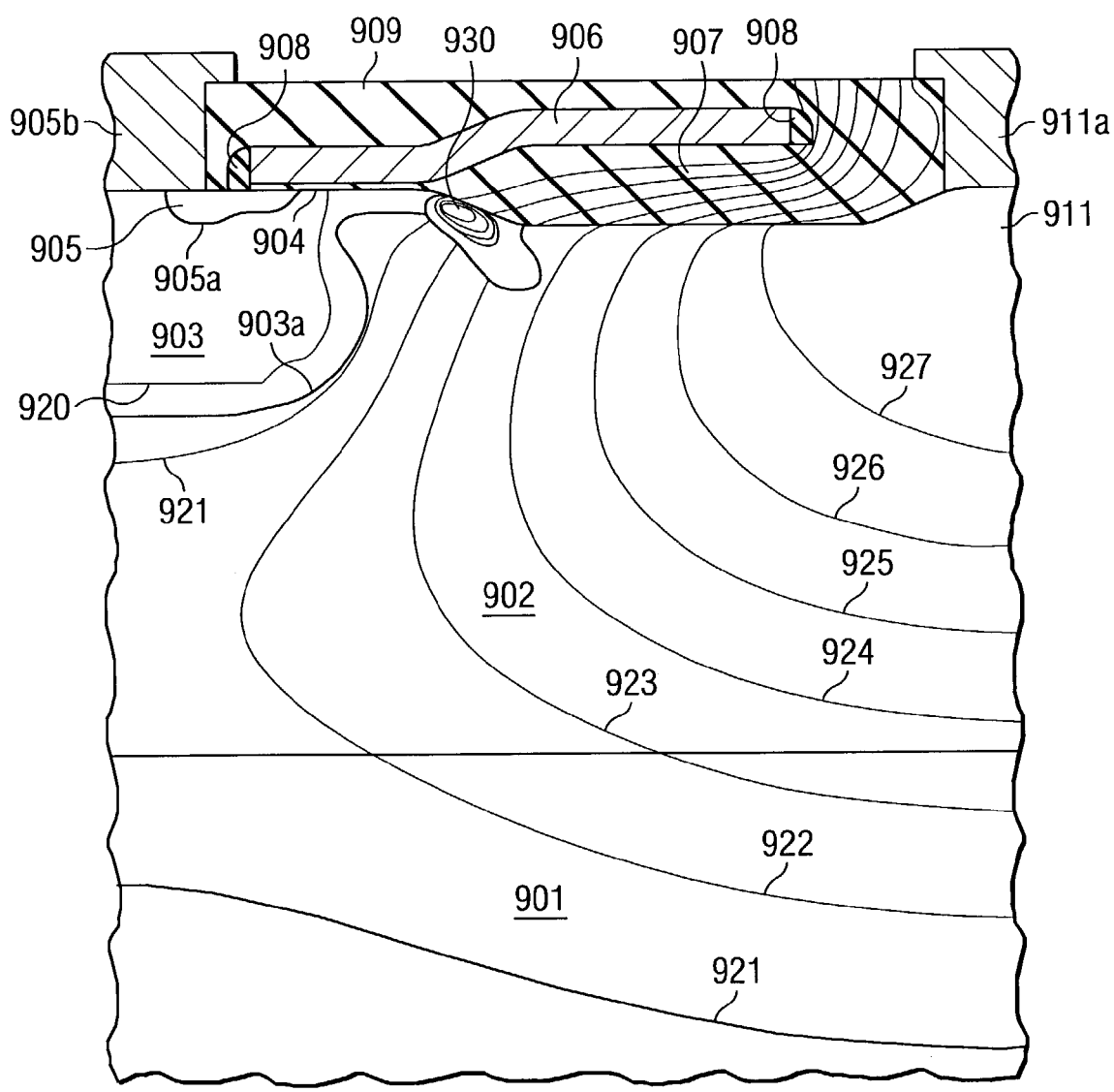
FIG. 9 is a schematic cross section through the "low side" LDMOS transistor of FIG. 8 along line A–A', showing electrical equipotential lines at breakdown and the location of breakdown by impact ionization.

FIG. 9 shows model-created electrical equipotential lines as they exist at electrical breakdown. Line 920 corresponds to 0 V. The lines progress in steps of 10 V to the line corresponding to 70 V. Line 921 corresponds to 10 V, line 922 to 20 V, line 923 to 30 V, line 924 to 40 V, line 925 to 50 V, line 926 to 60 V, and line 927 to 70 V.

At the edge of p-body 903 and thin gate oxide 904, where the electrical field is highest, the localized region of impact ionization 930 indicates the electrical breakdown phenomenon. It is in the region like this, where the present invention has its greatest impact. Referring now to the elongated "low side" LDMOS structure in FIG. 8, two regions are affected by early breakdown; they are marked by the heavy dashed lines 810. In the example displayed in FIG. 8, the affected areas are rectangles of lateral dimensions 810a and 810b, but it should be pointed out that these outlines and sizes are to be understood in approximate terms; the actual dimensions may vary according to exact computer calculations of breakdown locations and conditions. The approach, however, is clear: It is in the areas outlined by 810 where the patterned photoresist 403a as illustrated in FIG. 4 is to be applied so that the implantation of impurity ions can be blocked.

The subsequent diffusion of impurities from volumes having obtained the implanted ions into the regions having been blocked, will create the desired regions of diminished doping, or higher resistivity. These regions of higher resistivity are in the proximity of the semicircular end portions of the device. The computer-controlled amount of higher resistivity is suitable to lower the electrical field strength during device operation and thus compensate the increased field strength created by the curved p-n junctions in the semicircular end portions. Consequently, the device breakdown voltage near the semicircular end portions becomes equal to or greater than the breakdown voltage near the linear portions of the device.

Figure 10:
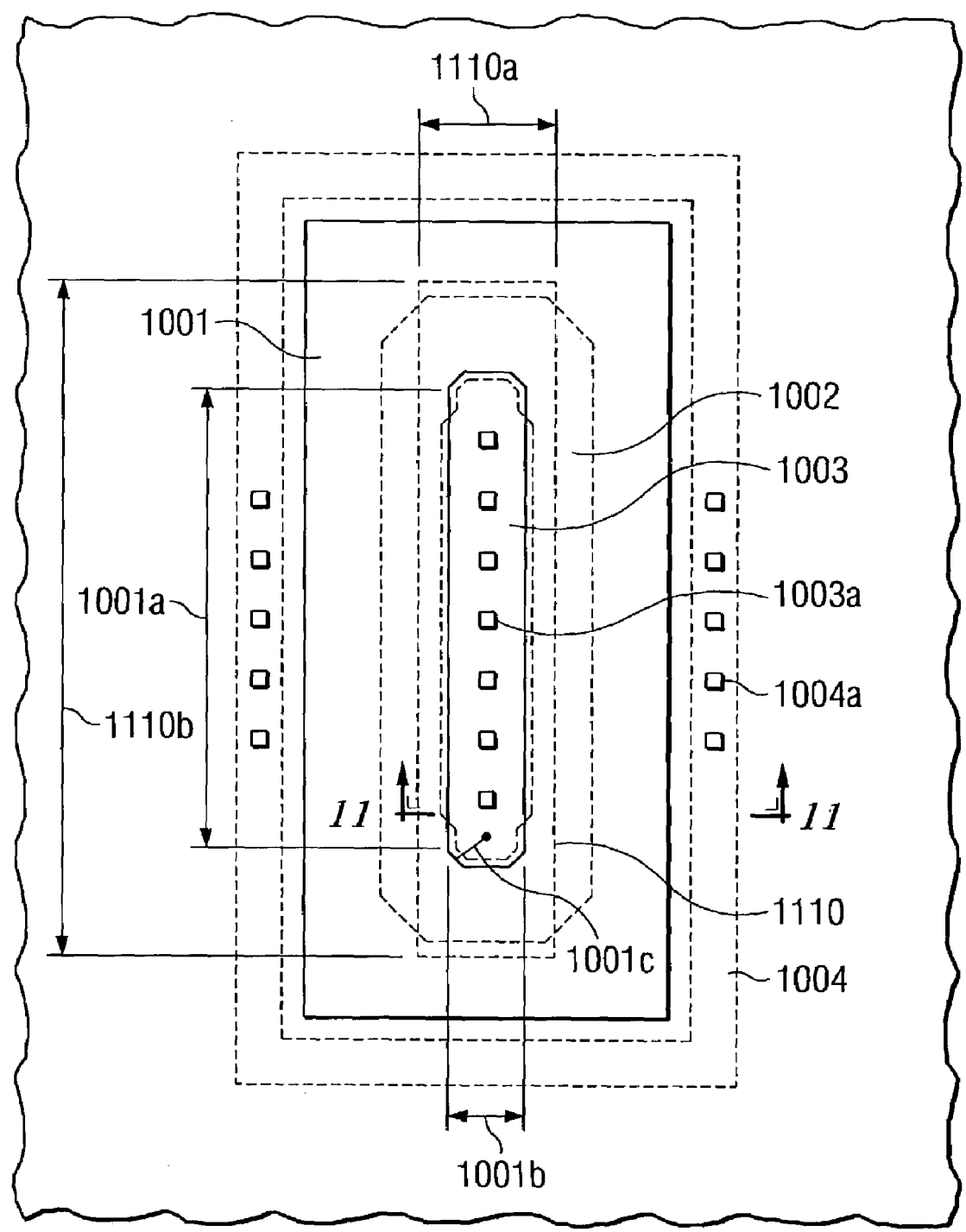
FIG. 10 shows a schematic top view of an elongated "high side" LDMOS transistor having a buried layer, with the preferred region for ion implantation cut-out.

The third embodiment of the invention is an elongated, lateral double diffused MOS (LDMOS) power transistor having a buried layer, as it is used as a "high side" LDMOS transistor. A schematic top view of a "high side" LDMOS transistor is shown in FIG. 10. Indicated by solid lines, the poly-silicon gate material 1001 has a racetrack shape in its inner outline, consisting of linear portions 1001a and semicircular end portions 1001b in the active transistor region. The inner radius 1001c of the semi-circular end portions for advanced LDMOS devices is of the order of 1 μm or less. The outer gate material outline is rectangular in order to better match the outline of the buried layer of the "high side" LDMOS transistor.

Under the poly-silicon 1001 are the thin gate oxide and the semiconductor of the first conductivity type 1002, often called "body", which defines the active gate area. Body 1002 also has racetrack contours. The inner body contour follows closely the inner gate contour, forming semicircular end portions of narrow radius (in advanced devices 1 μm or less). Body 1002 surrounds the source area 1003; source contacts are indicated by locations 1003a. Drain 1004 surrounds gate 1003; drain contacts are indicated by locations 1004a.

With a radius 1001c of only 1 μm or less for advanced device solutions, a significant increase of electrical field strength and thus lowering of breakdown voltage is unavoidable. This fact is illustrated by the model in FIG. 11, which shows a schematic cross section along line A–A' in FIG. 10 of the "high side" LDMOS under the condition of electrical breakdown. The example of FIG. 11 refers to a device with p-type substrate and body, but an analogous situation holds for n-type substrate and body. Over p-epitaxial silicon 1101 is the highly doped n-buried layer 1102. It transitions, without junction, into the lowly doped deep n-well 1003. Deep n-well contains the p–body 1104 (junction 1104a), which faces the thin gate oxide 1105 and surrounds the n+ source 1106 (junction 1106a). Source 1106 is contacted by source metal 1106b. Poly-silicon gate 1107 stretches over thin gate oxide 1105 and thick field oxide 1108. The poly-silicon material of the gate is surrounded by sidewall spacers 1109. An insulator 1110 covers gate 1107 and sidewall spacers 1109; the metallic contacts to the gate are not shown in FIG. 11. The heavily doped n+ drain is designated 1112 (the doping outlines are not shown in FIG. 11). Drain 1112 is contacted by drain metal 1112a.

Figure 11:
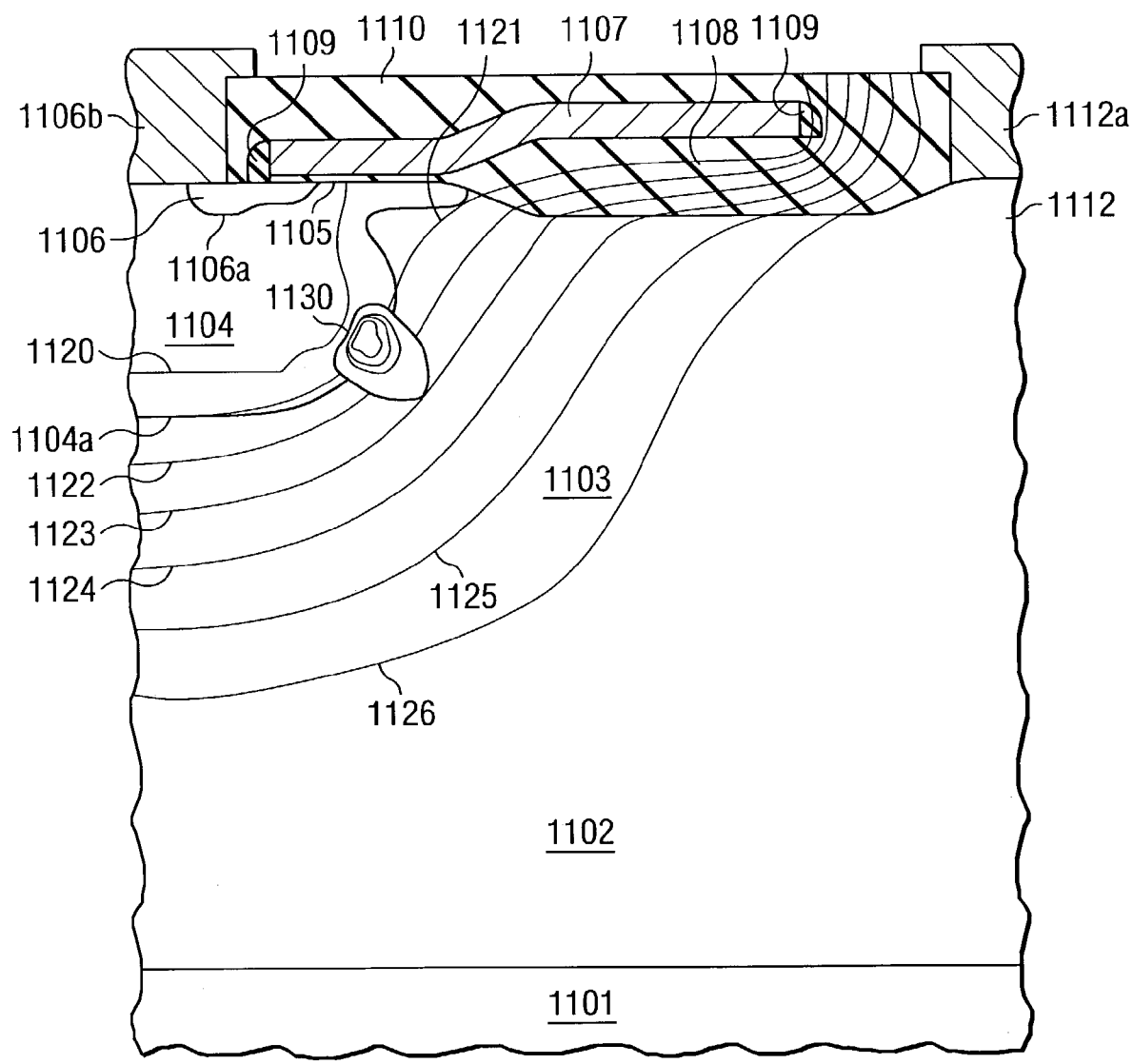
FIG. 11 is a schematic cross section through the "high side" LDMOS transistor of FIG. 10 along line A–A', showing electrical equipotential lines at breakdown and the location of breakdown by impact ionization.

FIG. 11 shows model-created electrical equipotential lines as they exist at electrical breakdown. Line 1120 corresponds to 0 V. The lines progress in steps of 10 V to the line corresponding to 60 V. Line 1121 corresponds to 10 V, line 1122 to 20 V, line 1123 to 30 V, line 1124 to 40 V, line 1125 to 50 V, and line 1126 to 60 V.

At the edge of p-body 1104 and deep n-well 1111, where the electrical field is highest, the localized region of impact ionization 1130 indicates the electrical breakdown phenomenon. It is in the region like this, where the present invention has its greatest impact. Referring now to the elongated "high side" LDMOS structure in FIG. 10, the whole length of the p-body is affected by early breakdown; it is marked by the heavy dashed lines 1110. In the example displayed in FIG. 11, the affected area is a rectangle of lateral dimensions 1110a and 110b, but it should be pointed out that these outlines and sizes are to be understood in approximate terms; the actual dimensions may vary according to exact computer calculations of breakdown locations and conditions. The approach, however, is clear: It is in the areas outlined by 1110 where the patterned photoresist 403a as illustrated in FIG. 4 is to be applied so that the implantation of impurity ions for the drain formation can be blocked.

The subsequent diffusion of impurities from volumes having obtained the implanted ions into the regions having been blocked, will create the desired regions of diminished doping, or higher resistivity. These regions of higher resistivity are in the proximity of the source region of the device. The computer-controlled amount of higher resistivity is suitable to lower the electrical field strength during device operation and thus compensate the increased field strength created by the existence of the buried n-layer. Consequently, the device breakdown voltage becomes less affected by the buried layer.

Figure 12:
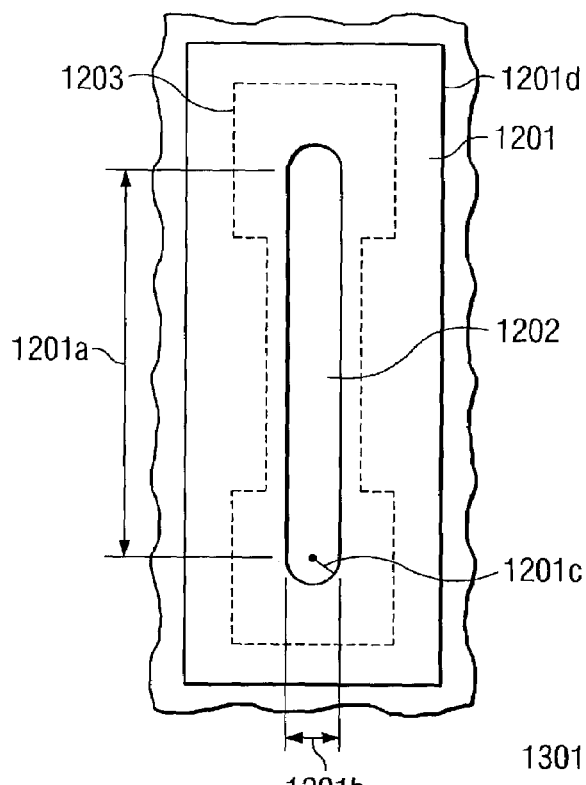
FIG. 12 is a schematic top view of an elongated "high side" LDMOS transistor, illustrating the "dog-bone" shaped photoresist mask pattern to improve the breakdown voltage.

The fourth embodiment of the invention is a combination of the innovations underlying the second and third embodiments, and is schematically illustrated in FIG. 12. The fourth embodiment is a "high-side" lateral double-diffused MOS (LDMOS) power transistor having an elongated configuration of the source and a buried layer of heavy doping between the transistor and the substrate. The gate is shaped to include elongated linear portions and semicircular end portions shown in top view in FIG. 12. Indicated by solid lines, the poly-silicon gate material 1201 has a racetrack shape in its inner outline, consisting of linear portions 1201a and semi-circular end portions 1201b in the active transistor region. The inner radius 1201c of the semi-circular end portions for advanced LDMOS devices is of the order of 1 µm or less. The outer gate material outline 1201d is rectangular in order to better match the outline of the buried layer of the "high side" LDMOS transistor.

Under the poly-silicon 1201 are the thin gate oxide and the semiconductor of the first conductivity type (similar to FIG. 10), often called "body", which defines the active gate area. "Body" also has racetrack contours. The inner body contour follows closely the inner gate contour, forming semicircular end portions of narrow radius (in advanced devices 1 µm or less). "Body" surrounds the source area 1202, and the drain surrounds the gate, similar to FIG. 10.

Analogous to the transistor examples described in FIGS. 8 and 10, the small dimension of radius 1201c of only 1 µm or less causes a significant increase of electrical field strength and thus lowering of breakdown voltage. According to the invention, this fact can be counteracted by a local lowering of the doping concentration of the n-well, in which the transistor is located.

As described above, the lower doping concentration is accomplished by a local "cutout" of the dopant ion implant of the n-well, using a patterned photoresist layer, followed by controlled diffusion of the drain doping. The "cutout" has geometrically the shape reminiscent of a "dogbone". In FIG. 12, the contour of the dog-bone is outlined by dashed lines 1203. The dimensions of the dog-bone heads and body can be independently adjusted, so that this geometry provides more control of the doping reduction. A large dog-bone head results is more doping reduction at the ends of the finger-shaped DLMOS, boosting the breakdown voltage. This stronger reduction at the finger ends is required because of the strongly curved semicircular end portions of the source geometry. Breakdown voltage increases up to 50% compared to transistors without the use of the "cutout" technique have been observed. A thin dog-bone body results in less doping reduction in the main body of the DLMOS, reducing the on-resistance.

In general, as a result of the "dog-bone" shaped cutout, the doping concentration of the drain diffusion is configured so that it exhibits both higher resistivity throughout the extent of the source region 1202 by an amount suitable to lower the electric field strength, and additional higher resistivity in the proximity of the semi-circular end portions by an amount suitable to lower the electrical field strength during device operation and thus offset the increased field strength caused by the semicircular end portions. Consequently, the device breakdown voltage near the curved end portions becomes equal to or greater than the breakdown voltage near the linear portions, and the breakdown voltage becomes less dependent on the buried layer.

Figure 13B:
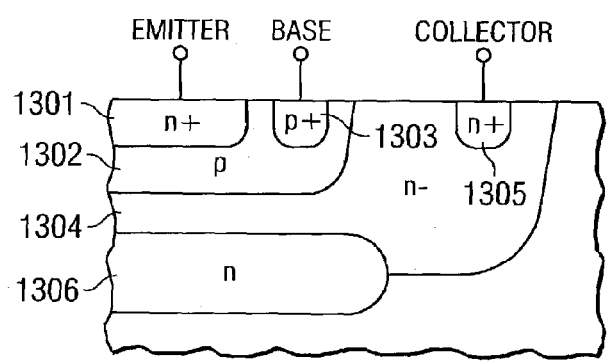
FIG. 13B shows a schematic cross section through the bipolar transistor of FIG. 13A along line A–A'.
Figure 13A:
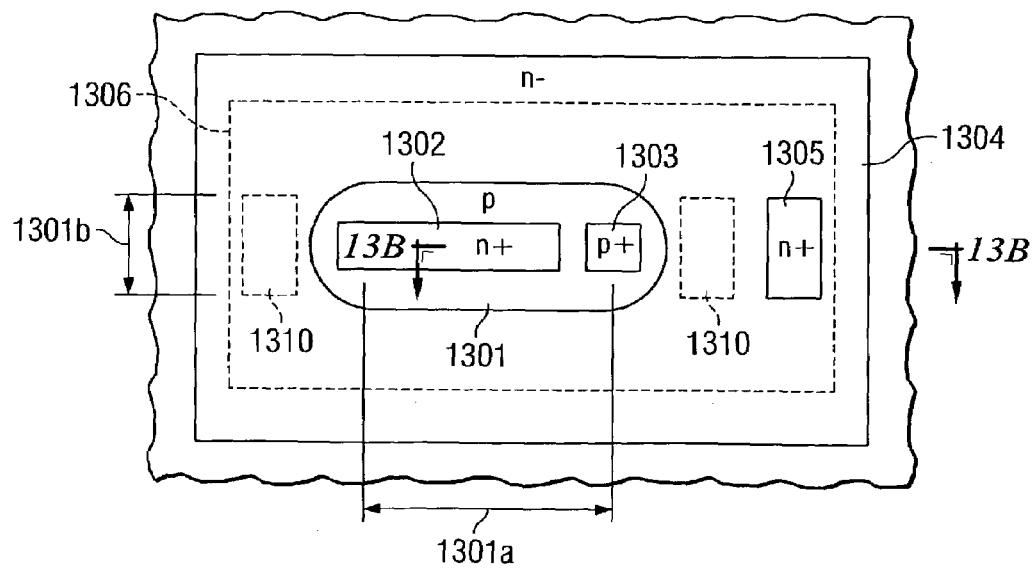
FIG. 13A is a schematic top view of an elongated bipolar transistor having linear and curved portions, for determining the cut-out regions of the dopant ion implantation.

The fifth embodiment of the invention is an elongated bipolar transistor with emitter, base and collector. FIG. 13A depicts a schematic top view such elongated transistor, FIG. 13B a schematic cross section along line A–A' in FIG. 13A. The example of FIGS. 13A and 13B considers an npn transistor, but analogous considerations hold for pnp transistors. The p base 1301 has an elongated shape including a linear portion 1301a and semicircular end portions 1301b. The elongated n+ emitter 1302 is embedded in the p base 1301. The contact to the base is provided by p+ contact 1303. The p base 1302 has an elongated shape similar to base 1302. The p base 1302 is located in n– tub 1304 (which functions analogous to the deep n well of the LDMOS transistor examples). The n– tub is contacted by n+ collector 1305. Furthermore, the bipolar transistor has an n buried layer 1306 (more heavily doped than the n– tub 1304).

As a consequence of this transistor structure, the collector-base junction is shaped to include elongated linear portions and curved portions. According to the invention, the doping concentration of the collector region is configured so that it exhibits higher resistivity in the proximity (regions 1310) of the curved portions by an amount suitable to lower the electrical field strength during device operation and thus offsets the increased field strength caused by the curved portions. Thus, the device breakdown voltage in the curved portions becomes equal to or greater than the breakdown voltage in the linear portions.

The method of creating the higher resistivity is the same as discussed in conjunction with FIG. 8. Patterned photoresist layers provide a "cutout" of the ion implant for the n– tub, followed by controlled diffusion of the collector doping into the blocked regions. The location of the cutout areas is in the proximity of the semicircular portions of the collector-base junction.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A method for fabricating LDMOS or bipolar integrated circuits having transistor and diode curved junction radii of one micron or less in a silicon substrate wafer of a first conductivity type, wherein said diodes include multi-fingered power diodes, comprising the steps of:

growing screen oxide on said wafer about 20 to 30 nm thick for surface protection;

depositing a layer of photoresist on said wafer in a thickness suitable for shielding against ion implant, and soft-baking said photoresist;

aligning a mask to said wafer defining the extent of the deep well of the opposite conductivity, for high voltage operation;

exposing the masked photoresist to ultraviolet light, and baking said photoresist;

developing said photoresist to pattern it by removing the portions exposed to said light;

hard-baking said photoresist;

implanting at high energy and medium dose ions of the opposite conductivity type;

stripping said patterned photoresist layer; and diffusing said implanted ions to define the outline of said well of opposite conductivity and to create a region of light doping and thus high resistivity for the curved junction portions of the intended devices.

2. A method as in claim 1 wherein a heavily-doped buried layer is included adjacent said substrate and said deep well of opposite conductivity type.

3. A method as in claim 1 wherein said first conductivity type is n-type.

4. A method as in claim 1 wherein said first conductivity type is p-type.

* * * * *